(12) United States Patent
Yang et al.

(10) Patent No.: US 10,665,450 B2
(45) Date of Patent: May 26, 2020

(54) METHODS AND APPARATUS FOR DOPING ENGINEERING AND THRESHOLD VOLTAGE TUNING BY INTEGRATED DEPOSITION OF TITANIUM NITRIDE AND ALUMINUM FILMS

(71) Applicant: APPLIED MATERIALS, INC., Santa Clara, CA (US)

(72) Inventors: Yixiong Yang, San Jose, CA (US); Paul F. Ma, Santa Clara, CA (US); Wei V. Tang, Santa Clara, CA (US); Wenyu Zhang, San Jose, CA (US); Shih Chung Chen, Cupertino, CA (US); Chen Han Lin, Campbell, CA (US); Chi-Chou Lin, San Jose, CA (US); Yi Xu, San Jose, CA (US); Yu Lei, Foster City, CA (US); Naomi Yoshida, Sunnyvale, CA (US); Lin Dong, San Jose, CA (US); Siddarth Krishnan, Newark, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/104,352

(22) Filed: Aug. 17, 2018

(65) Prior Publication Data
US 2019/0057863 A1 Feb. 21, 2019

Related U.S. Application Data

(60) Provisional application No. 62/547,754, filed on Aug. 18, 2017.

(51) Int. Cl.
*H01L 21/02* (2006.01)
*H01L 29/40* (2006.01)
(Continued)

(52) U.S. Cl.
CPC .... *H01L 21/02321* (2013.01); *H01L 21/0228* (2013.01); *H01L 21/02181* (2013.01);
(Continued)

(58) Field of Classification Search
CPC ......... H01L 21/02321; H01L 21/28088; H01L 21/28176; H01L 21/02172; H01L 21/28158; H01L 29/517; H01L 29/401
See application file for complete search history.

(56) References Cited

U.S. PATENT DOCUMENTS 7,838,908 B2 * 11/2010 Kwon ............. H01L 21/823807
257/204
8,445,344 B2 * 5/2013 Carter ............... H01L 21/28088
257/E21.625
9,013,000 B2 4/2015 Choi
(Continued)

OTHER PUBLICATIONS

International Search Report and Written Opinion dated Dec. 17, 2018 for PCT Application No. PCT/US2018/047054.

*Primary Examiner* — Joseph C. Nicely
(74) *Attorney, Agent, or Firm* — Moser Taboada; Alan Taboada (57) ABSTRACT

Methods and apparatus for forming a semiconductor structure, including depositing a doping stack having a first surface atop a high-k dielectric layer, wherein the doping stack includes at least one first metal layer having a first surface, at least one second metal layer comprising a first aluminum dopant and a first surface, wherein the second metal layer is atop the first surface of the first metal layer, and at least one third metal layer atop the first surface of the second metal layer; depositing an anneal layer atop the first surface of the doping stack; annealing the structure to diffuse at least the first aluminum dopant into the high-k dielectric layer; removing the anneal layer; and depositing at least one work function layer atop the first surface of the doping stack.

20 Claims, 6 Drawing Sheets

(51) Int. Cl.
   *H01L 21/28* (2006.01)
   *H01L 29/51* (2006.01)
   *H01L 29/49* (2006.01)

(52) U.S. Cl.
   CPC .. *H01L 21/02532* (2013.01); *H01L 21/28088* (2013.01); *H01L 21/28158* (2013.01); *H01L 21/28176* (2013.01); *H01L 29/401* (2013.01); *H01L 29/517* (2013.01); *H01L 29/4966* (2013.01)

(56) References Cited

U.S. PATENT DOCUMENTS

| | | |
|---|---|---|
| 2002/0102814 A1 | 8/2002 | Olsen |
| 2007/0212896 A1 | 9/2007 | Olsen et al. |
| 2009/0098693 A1* | 4/2009 | Nakajima ......... H01L 21/82384 438/199 |
| 2012/0045876 A1* | 2/2012 | Kawahara ......... H01L 21/82384 438/231 |
| 2012/0138953 A1 | 6/2012 | Cai et al. |
| 2013/0122697 A1 | 5/2013 | Lu et al. |
| 2013/0256802 A1* | 10/2013 | Jagannathan ..... H01L 21/28518 257/368 |
| 2014/0183651 A1 | 7/2014 | Lee et al. |
| 2014/0319616 A1* | 10/2014 | Baudot ............. H01L 21/28079 257/369 |
| 2015/0129973 A1 | 5/2015 | Ji et al. |
| 2015/0255463 A1* | 9/2015 | Ando ................ H01L 21/28088 257/371 |
| 2016/0027664 A1* | 1/2016 | Ando ................ H01L 21/32133 438/591 |
| 2016/0104707 A1* | 4/2016 | Kannan ............. H01L 27/0922 257/369 |
| 2017/0103897 A1 | 4/2017 | Ando et al. |
| 2017/0179252 A1 | 6/2017 | Tang et al. |

\* cited by examiner

METHODS AND APPARATUS FOR DOPING ENGINEERING AND THRESHOLD VOLTAGE TUNING BY INTEGRATED DEPOSITION OF TITANIUM NITRIDE AND ALUMINUM FILMS

FIELD

Embodiments of the present disclosure generally relate to the field of semiconductor manufacturing processes.

BACKGROUND

Metal gate/high-k stacks are being increasingly used in metal-oxide-semiconductor field-effect-transistors (MOS-FETs) in the 10 nm technology node and beyond, however the inventors have observed that many challenges remain in the art. In particular, the development of transistor technology to more advanced nodes (n<10 nm) requires smaller/thinner materials which can lead to gate leakage. Moreover, the inventors have observed that tuning the threshold voltage (Vt) is problematic for transistors with a P type work function which should be close to silicon bandedge (~5.0 eV).

Accordingly, the inventors have provided improved methods and apparatus for treating high-k materials to modulate the threshold voltage (Vt) thereof.

SUMMARY

Methods and apparatus for making a semiconductor structure are provided herein. In some embodiments, a method includes forming a semiconductor structure, including: depositing a doping stack having a first surface atop a high-k dielectric layer, wherein the doping stack includes at least one first metal layer having a first surface, at least one second metal layer including a first aluminum dopant and a first surface, wherein the second metal layer is atop the first surface of the first metal layer, and at least one third metal layer atop the first surface of the second metal layer; depositing an anneal layer atop the first surface of the doping stack; annealing the structure to diffuse at least the first aluminum dopant into the high-k dielectric layer; removing the anneal layer; and depositing at least one work function layer atop the first surface of the doping stack.

In some embodiments, a method includes treating a high-k dielectric layer including: depositing a first titanium nitride layer atop a high-k dielectric layer; depositing a first aluminum layer atop the first titanium nitride layer; depositing a second titanium nitride layer atop the first aluminum layer; and annealing the high-K dielectric layer, first titanium nitride layer, first aluminum layer and second titanium nitride layer at a temperature at or above 900° C.

In some embodiments, a method includes treating a high-k dielectric layer disposed on a substrate, including: sequentially depositing a first titanium nitride layer, a first aluminum layer, and second titanium nitride layer atop a high-K dielectric layer; and heating the dielectric layer to a peak temperature of about 900° C. to about 1200° C., wherein the aluminum from the first aluminum layer diffuses into and/or caps the high-k dielectric layer.

In some embodiments, an apparatus includes a PMOS gate electrode, including: an aluminum doped high-k dielectric layer having a first surface disposed atop a semiconductor layer including a PMOS area; and at least one work function layer disposed atop the first surface of the aluminum doped high-k dielectric layer; wherein the aluminum doped high-k dielectric layer includes a first dipole-interface sufficient to tune a threshold voltage of the PMOS gate electrode and provide an effective work function of about 5.0 eV.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide methods for processing a high-k dielectric layer of a semiconductor structure that advantageously provide a first dipole-interface sufficient to tune a threshold voltage of a PMOS gate electrode and provide an effective work function of about 5.0 eV.

Figure 1:
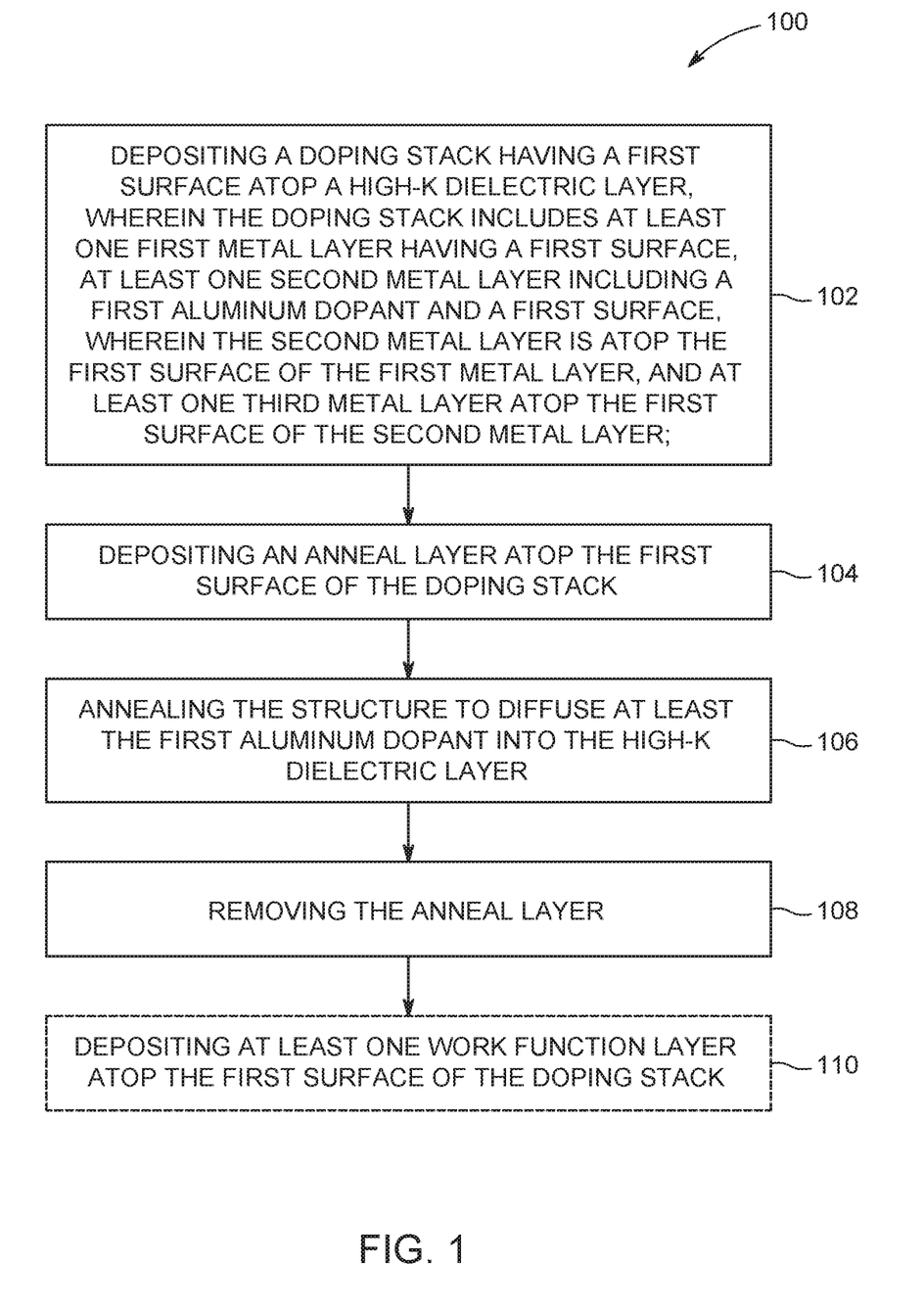
FIG. 1 depicts a flow diagram of a method for depositing a doping stack atop a high-k dielectric layer in accordance with some embodiments of the present disclosure.

FIG. 1 is a flow diagram of a method 100 for depositing a doping stack atop a high-k dielectric layer in accordance with some embodiments of the present disclosure. The method 100 is described below with respect to the stages of processing a substrate as depicted in FIGS. 2A-2E and may be performed, for example, in a suitable reactor, such as is described below with respect to FIG. 6. Exemplary processing systems that may be used to perform the methods disclosed herein may include, but are not limited to, any of the ENDURA®, CENTURA®, or PRODUCER® brand processing systems, commercially available from Applied Materials, Inc., of Santa Clara, Calif. Other process chambers, including ones available from other manufacturers, may also be suitably used in connection with the teachings provided herein.

The method 100 is typically performed on a high-k dielectric layer 200 (e.g., disposed on a substrate) provided to a processing volume of a process chamber, for example substrate processing chamber 614 described below with respect to FIG. 6. In some embodiments, as shown in FIG. 1 at 102, and FIG. 2A, the high-k dielectric layer 200 includes a doping stack 210 having a first surface 212 on top of and contacting the high-k dielectric layer 200. In embodiments, the doping stack 210 includes at least one first metal layer 214. First metal layer 214 has a first surface 216. Doping stack 210 also includes at least one second metal layer 218 having a first aluminum dopant 219 and a first surface 220. In embodiments, the second metal layer 218 is on top of and contacting the first surface 216 of the first metal layer 214. Doping stack 210 may also include at least one third metal layer 224 is one top of and contacting the first surface 220 of the second metal layer 218.

Figure 2A:
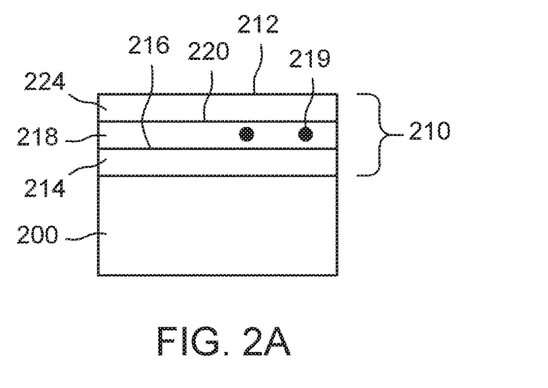
FIGS. 2A-2E respectively depict the stages of fabrication of depositing a doping stack in accordance with some embodiments of FIG. 1 of the present disclosure.

The high-k dielectric layer 200 may be any suitable layer having a high dielectric constant as compared to silicon dioxide (3.9). A non-limiting example of a high-k dielectric material includes materials having a dielectric constant greater than 7. The high-k dielectric layer may include a metal oxide. Non-limiting examples of suitable metal oxides for use in accordance with the present disclosure include an oxide containing a metal such as hafnium (Hf). For example, the metal oxide may include hafnium oxide or $HfO_2$. Non-limiting examples of high-k dielectric materials suitable for making layers in accordance with the present disclosure include hafnium(IV) oxide ($HfO_2$)), titanium dioxide ($TiO_2$), tantalum pentoxide ($Ta_2O_5$), cerium(IV) oxide ($CeO_2$), barium zirconate titanate (BZT) such as (BaZrTiO_3), or aluminum oxide ($Al_2O_3$) and combinations thereof. In embodiments, the high-k dielectric layer includes hafnium aluminum oxide (HfAlO), nitrided hafnium aluminate (HfAlON), hafnium silicon alumina nitride (HfSiAlON), hafnium lanthanum oxynitride (HfLaON), and combinations thereof. In embodiments, the high-k dielectric layer 200 has a thickness of 1 to 5 nm across a semiconductor substrate. In embodiments, the high-k dielectric layer 200 is formed by one of physical vapor deposition, chemical vapor deposition, and atomic layer deposition. In embodiments, the high-k dielectric layer 200 is an about 2.5 nm thick layer of $HfO_2$ deposited by atomic layer deposition. In embodiments, hafnium (IV) oxide ($HfO_2$) may be deposited on a substrate by any suitable atomic layer deposition method known in the art.

In embodiments, doping stack 210 having a first surface 212 may include layers sufficient to dope high-k dielectric layer 200 as described herein. For example, at least one first metal layer 214 having a first surface 216 may be disposed on top of and in contact with the high-k dielectric layer 200. In embodiments, first metal layer 214 may be made of any suitable metal. Non-limiting examples of suitable metal material for first metal layer 214 includes metal-containing material such as a metal nitride, for example, a refractory metal nitride (e.g., titanium nitride or TiN). First metal layer 214 may be deposited on top of and in contact with the high-k dielectric layer 200 to a predetermined thickness. In embodiments, the first metal layer 214 has a thickness of about 2 to 10 angstroms (Å), or about 5 angstroms. In embodiments, the first metal layer 214 is formed by physical vapor deposition, chemical vapor deposition, and atomic layer deposition. In embodiments, the first metal layer 214 is a TiN layer having a thickness of about 5 angstroms disposed on top of and in contact with the high-k dielectric layer, and is deposited by atomic layer deposition or chemical vapor deposition.

Still referring to FIGS. 2A-E, doping stack 210 may also include at least one second metal layer 218 having a first aluminum dopant 219 and a first surface 220. In embodiments, the second metal layer 218 is disposed on top of and in contact with the first surface 216 of the first metal layer 214. In embodiments, second metal layer 218 may be made of any suitable aluminum composition, including pure unadulterated aluminum (Al). Non-limiting examples of suitable aluminum compositions include titanium aluminide (TiAl), titanium-aluminum carbide (TiAlC), titanium aluminum nitride (TiAlN), aluminum nitride (AlN), aluminum carbide (AlC), aluminum oxide ($Al_2O_3$), hafnium aluminide carbide (HfAlC), or combinations thereof.

In embodiments, second metal layer 218 is deposited on top of and in contact with the first metal layer 214 to a predetermined thickness. In embodiments, the second metal layer 218 has a thickness of about 2 to 10 angstroms, or about 5 angstroms. The second metal layer 218 may be formed by physical vapor deposition, chemical vapor deposition, or atomic layer deposition. In embodiments, the second metal layer 218 is TiAl, TiAlC, TiAlN, AlN, AlC, $Al_2O_3$, or HfAlC, having a thickness of about 5 angstroms, is disposed on top of the first metal layer 214, and is deposited by atomic layer deposition or chemical vapor deposition. In embodiments, the second metal layer 218 is TiAl, TiAlC, TiAlN, AlN, AlC, $Al_2O_3$, or HfAlC applied an in amount sufficient to deposit a film on top of a first metal layer 214.

In embodiments, doping stack 210 includes at least one third metal layer 224 disposed on top of and in contact with the first surface 220 of the second metal layer 218. In embodiments, third metal layer 224 may be made of any suitable metal. Non-limiting examples of suitable metal material for third metal layer 224 includes metal-containing material such as a metal nitride, for example a refractory metal nitride (e.g., titanium nitride or TiN). Third metal layer 224 is deposited atop the second metal layer 218 to a predetermined thickness. In embodiments, the third metal layer 224 has a thickness of about 2 to 15 angstroms, or about 10 angstroms. The third metal layer 224 may be formed by physical vapor deposition, chemical vapor deposition, or atomic layer deposition. In embodiments, the third metal layer 224 is TiN, having a thickness of about 10 angstroms, is disposed on top of the second metal layer 218, and is deposited by atomic layer deposition or chemical vapor deposition. The third metal layer 224 may be formed to be thicker than the first metal layer 214.

Figure 2B:
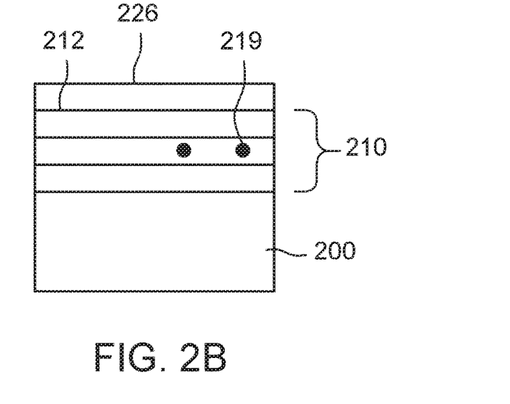

Referring to FIG. 1 at 104 and FIG. 2B, the methods of the present disclosure include depositing an anneal layer 226 atop the first surface 212 of the doping stack 210 (e.g., atop the third metal layer 224 See FIG. 2A). The anneal layer 226 may be any suitable material for shielding the doping stack 210 from heat applied directly thereto. In embodiments, anneal layer 226 is an inert material that coats doping stack 210. Non-limiting examples of suitable anneal layer material for anneal layer 226 includes silicon or polysilicon. Anneal layer 226 is deposited atop the doping stack 210 to a predetermined thickness. In embodiments, the anneal layer 226 has a thickness of about 5 to 15 nanometers (nm), or about 10 nanometers. In embodiments, anneal layer 226 is polysilicon having a thickness of about 5 to 100 nanometers, or about 25 nanometers.

Figure 2C:
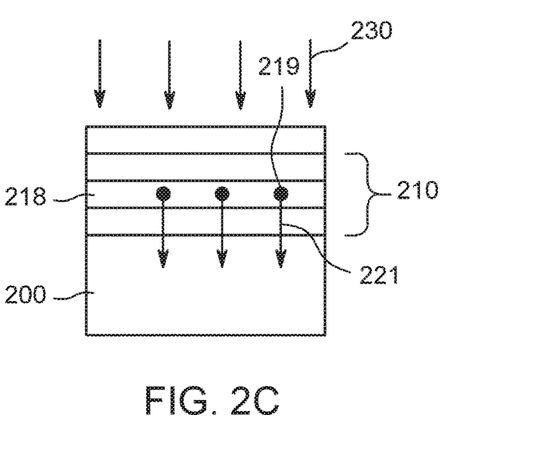

Referring now to FIG. 1 at 106, and FIG. 2C the methods of the present disclosure include annealing such as annealing a structure including the high-k dielectric layer 200, the doping stack 210, and the anneal layer 226 to diffuse at least a first aluminum dopant 219 into and/or onto the high-k dielectric layer 200. Arrows within the structure shown in FIG. 2C represent the diffusion or movement of a first aluminum dopant 219 into the high-k dielectric layer 200. In embodiments, the dopant will travel in the direction of arrow 221 depending upon the intensity of anneal. In some embodiments, the dopant will travel a distance such as along arrow 221 and accumulate at the top surface of the high-K dielectric layer 200, and in embodiments first aluminum dopant 219 is provided in an amount sufficient to cap the high-k dielectric layer. For example a cap of first aluminum dopant 219 may cover the entire top surface of high-K dielectric layer 200. Heat shown as arrow 230, or arrows outside the structure of FIG. 2C, is applied in a thermal process in an amount sufficient to diffuse first aluminum dopant 219 from second metal layer 218 into and/or onto high-k dielectric layer 200. In embodiments, heat is applied in an amount and duration sufficient to diffuse first aluminum dopant 219 from second metal layer 218 into and/or onto high-k dielectric layer 200 depending upon process conditions. In embodiments, high-k dielectric layer 200 is both doped (e.g., aluminum is diffused into the high-k dielectric layer 200) and capped (e.g., aluminum is disposed on the high-k dielectric layer 200) with the first aluminum dopant 219. In embodiments, annealing includes a thermal heating process where the structure is heated (shown as arrow 230) to a temperature of at least 700° C., such as 700° C. to 1500° C. In embodiments, heat shown as arrow 230 is applied to the structure for 1 to 60 seconds, or 3 to 10 seconds, or 5 seconds, or 4 seconds, or 3 seconds, or 2 seconds, or 1 second.

Figure 2D:
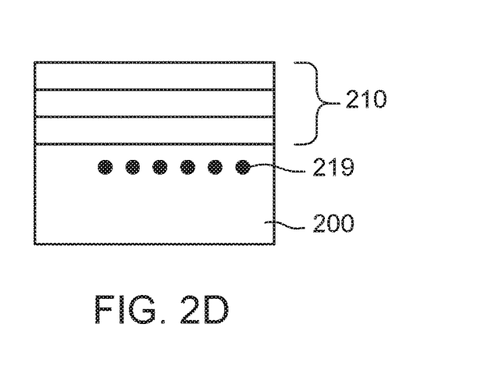

Referring now to FIG. 1 at 108, and FIG. 2D, embodiments of methods of the present disclosure include removing the anneal layer 226. Anneal layer 226 is removed from the doping stack 210 by any suitable method known in the art such as wet edge or dry edge removal processes. In embodiments, anneal layer 226 is removed after the anneal has diffused or moved the first aluminum dopant 219 from doping stack 210 into and/or onto high-k dielectric layer 200

Figure 2E:
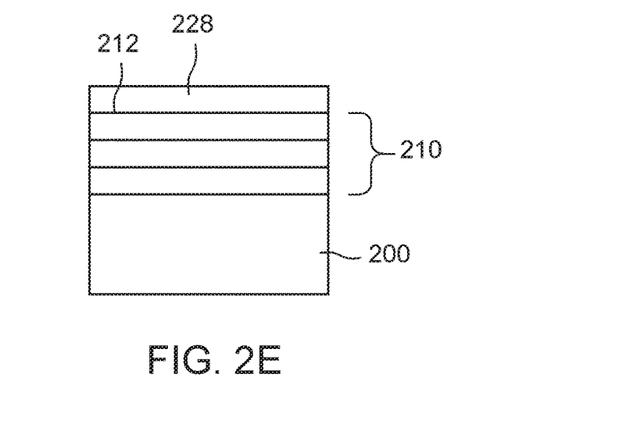

Referring now to FIG. 1 at 110, and FIG. 2E, the methods of the present disclosure may optionally include depositing at least one work function layer 228 on top of and in contact with the first surface 212 of the doping stack 210. Work function layer 228 may be made of any suitable work function material for a PMOS electrode such as a P type work function material. Non-limiting examples of suitable work function materials include metal containing materials such as metal nitrides, or refractory metal nitrides, such as titanium nitride (TiN), or the like. In embodiments, work function layer 228 may be deposited to a predetermined thickness atop the doping stack 210. In embodiments, the work function layer 228 has a thickness of about 15 to 40 angstroms, or about 30 angstroms. In embodiments, the work function layer 228 is formed by physical vapor deposition, chemical vapor deposition, or atomic layer deposition. In embodiments, the work function layer 228 is TiN, having a thickness of about 30 angstroms atop the doping stack 210, and is deposited by atomic layer deposition or chemical vapor deposition. In embodiments, (not shown in FIG. 1 or 2), additional work function layers may be deposited atop the work function layer 228. For example, tungsten may be deposited to a thickness sufficient to perform as an effective work function layer. In embodiments, tungsten has a thickness of about 10 to 40 nm, such as 30 nanometers deposited by a suitable deposition process such as chemical vapor deposition. Tungsten may be deposited under suitable conditions known in the art, such as those described in U.S. Pat. No. 7,964,505 entitled Atomic Layer Deposition of Tungsten Materials granted on 21 Jun. 2011 and assigned to Applied Materials, Inc.

Figure 3:
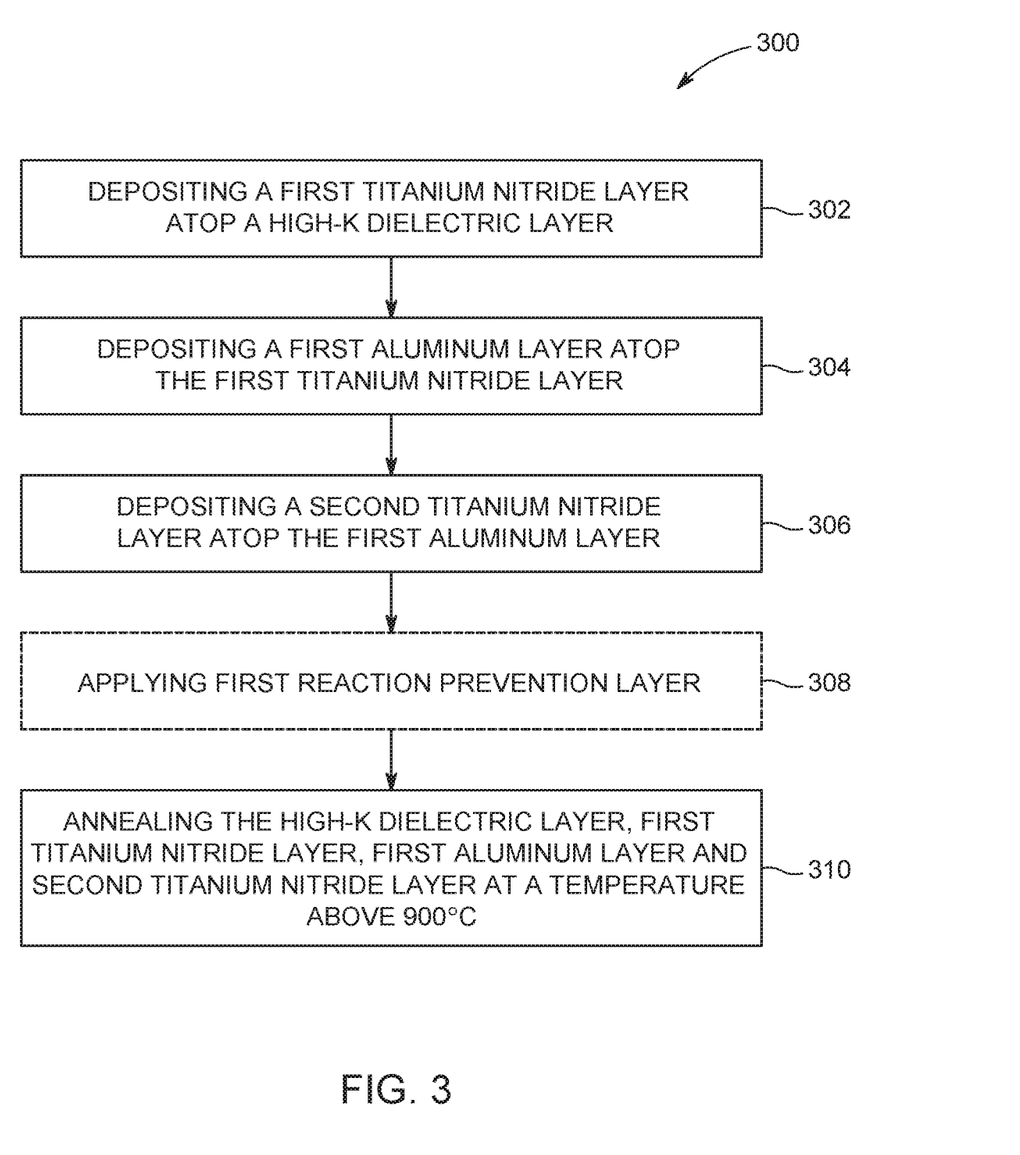
FIG. 3 depicts a flow diagram of a method for treating a high-k dielectric layer with some embodiments of the present disclosure.

FIG. 3 is a flow diagram of a method 300 for depositing a doping stack atop a high-k dielectric layer in accordance with some embodiments of the present disclosure. The method 300 is described below with respect to the stages of processing a substrate as depicted in FIGS. 4A-4F and may be performed, for example, in a suitable reactor, such as is described below with respect to FIG. 6. Exemplary processing systems that may be used to perform the methods disclosed herein may include, but are not limited to, any of the ENDURA®, CENTURA®, or PRODUCER® brand processing systems, commercially available from Applied Materials, Inc., of Santa Clara, Calif. Other process chambers, including ones available from other manufacturers, may also be suitably used in connection with the teachings provided herein.

The method 300 is typically performed on a high-k dielectric layer 400 provided to a processing volume of a process chamber, for example substrate processing chamber 614 described below with respect to FIG. 6. In embodiments, the high-k dielectric layer 400 may be the same material such as high-k dielectric layer 200 described above. In some embodiments, as shown in in FIG. 3 at method 300, and FIG. 4A, the high-k dielectric layer 400 is treated by depositing layers thereon. Referring to method 300 at 302 and FIG. 4A, method 300 includes depositing a first titanium nitride layer 414 on top of and in contact with a high-k dielectric layer 400. In embodiments, the first titanium nitride layer 414 is formed by physical vapor deposition, chemical vapor deposition, or atomic layer deposition. In embodiments, the first titanium nitride layer 414 is TiN having a thickness of about 5 angstroms deposited by atomic layer deposition or chemical vapor deposition.

Figure 4A:
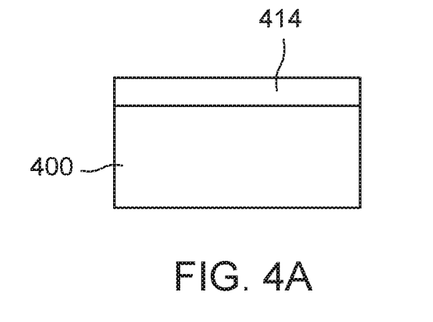
FIGS. 4A-4F respectively depict the stages of fabrication of a treated high-k dielectric layer in accordance with some embodiments of FIG. 3 of the present disclosure.
Figure 4B:
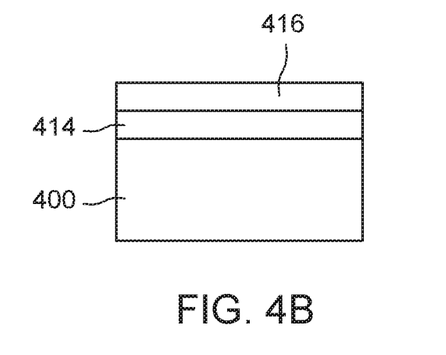

Referring to FIG. 3 at 304 and FIG. 4B, methods in accordance with the present disclosure include depositing a first aluminum layer 416 atop the first titanium nitride layer 414. The first aluminum layer 416 may be any suitable material for including aluminum effective for doping the high-k dielectric layer 400. Non-limiting examples of suitable aluminum compositions include TiAl, TiAlC, TiAlN, AlN, AlC, $Al_2O_3$, HfAlC, or combinations thereof.

In embodiments, first aluminum layer 416 may be deposited on top of and in contact with first titanium nitride layer 414 to a predetermined thickness. In embodiments, the first aluminum layer 416 may have a thickness of about 2 to 10 angstroms or about 5 angstroms. In embodiments, the first titanium nitride layer 414 is formed by physical vapor deposition, chemical vapor deposition, or atomic layer deposition. In embodiments, the first aluminum layer 416 is TiAl, TiAlC, TiAlN, AlN, AlC, $Al_2O_3$, HfAlC, or combinations thereof, deposited to a thickness of about 5 angstroms on top of the first titanium nitride layer 414 by atomic layer deposition or chemical vapor deposition. In embodiments, the first aluminum layer 416 is a film atop a first titanium nitride layer 414.

Figure 4C:
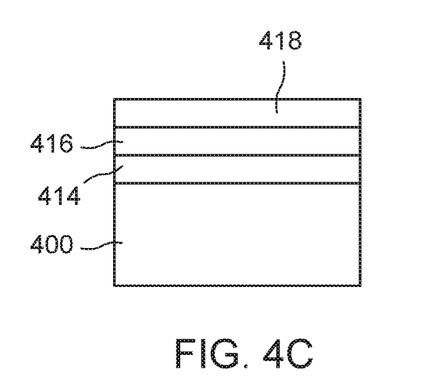

Referring to FIG. 3 at 306 and FIG. 4C, methods in accordance with the present disclosure include depositing at least a second titanium nitride layer 418 on top of and in contact with first aluminum layer 416. In embodiments, second titanium nitride layer 418 is made of titanium nitride or TiN, deposited to a predetermined thickness. In embodiments, the second titanium nitride layer 418 may have a thickness of about 5 to 15 angstroms or about 10 angstroms. In embodiments, the second titanium nitride layer 418 is formed by physical vapor deposition, chemical vapor deposition, or atomic layer deposition. In embodiments, the second titanium nitride layer 418 is TiN deposited to a thickness of about 10 angstroms atop a layer by atomic layer deposition or chemical vapor deposition.

Figure 4D:
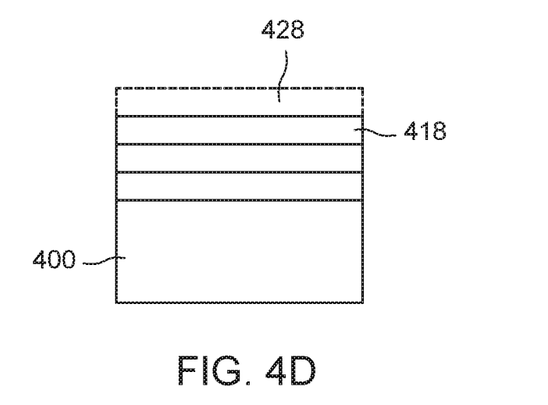

Referring to FIG. 3 at 308 (shown in phantom) and FIG. 4D, methods in accordance with the present disclosure optionally include applying a first reaction prevention layer 428 (shown in phantom) on top of and in contact with the second titanium nitride layer 418. The first reaction prevention layer 428 may be any suitable material for shielding the first titanium nitride layer 414, first aluminum layer 416, and second titanium nitride layer 418 in accordance with the present disclosure. Shielding may protect the structure from process conditions such as heat, reactants, or byproducts formed during the annealing described below. In embodiments, first reaction prevention layer 428 is an inert material such as silicon or polysilicon. The first reaction prevention layer 428 may be deposited to a predetermined thickness. In embodiments, the first reaction prevention layer 428 deposited to a thickness of about 5 to 15 nanometers or about 10 nanometers.

Figure 4E:
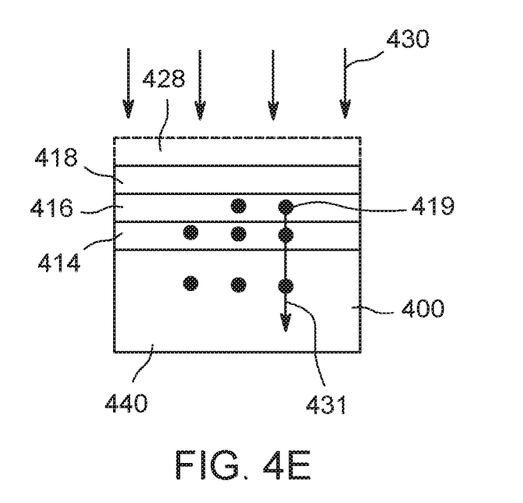

Referring to FIG. 3 at 310 and FIG. 4E, methods in accordance with the present disclosure include annealing the high-k dielectric layer 400, first titanium nitride layer 414, first aluminum layer 416 and second titanium nitride layer 418 at a temperature at or above 900° C. Heat shown as arrow 430 is applied in a high thermal process in an amount sufficient to diffuse aluminum dopant 419 from first aluminum layer 416 into high-k dielectric layer 400. In embodiments, heat is applied in an amount and duration sufficient to diffuse aluminum dopant 419 from first aluminum layer 416 into and onto high-k dielectric layer 400 such as along arrow 431 showing a diffusion pathway of a first aluminum dopant 419. In embodiments, the high-k dielectric layer 400 is doped and/or capped in aluminum dopant 419 such as the capping layer 480 shown in FIG. 4F. In embodiments, annealing includes a high thermal heating process where the structure is heated to a temperature of 700° C. and above, such as 700° C. to 1500° C. In some embodiments, annealing at a temperature above 700° C. diffuses aluminum from the first aluminum layer at least one of into or onto the high-k dielectric layer 400. In embodiments, heat is applied to the structure for 1 to 60 seconds, or 3 to 10 seconds, or 5 seconds, or 4 seconds, or 3 seconds, or 2 seconds, or 1 second. In some embodiments, annealing comprises heating the doping stack to a temperature at or above 700° C. In some embodiments, the methods in accordance with the present disclosure include annealing the high-k dielectric layer 400, first titanium nitride layer 414, first aluminum layer 416 and second titanium nitride layer 418 at a temperature at or above 900° C. include a first titanium nitride layer having a thickness of about 2 angstroms to about 10 angstroms. In some embodiments, the second titanium nitride layer has a thickness of about 5 angstroms to about 15 angstroms. In some embodiments, the first titanium nitride layer has a thickness of about 2 angstroms to about 10 angstroms, and the second titanium nitride layer has a thickness of about 5 angstroms to about 15 angstroms.

Figure 4F:
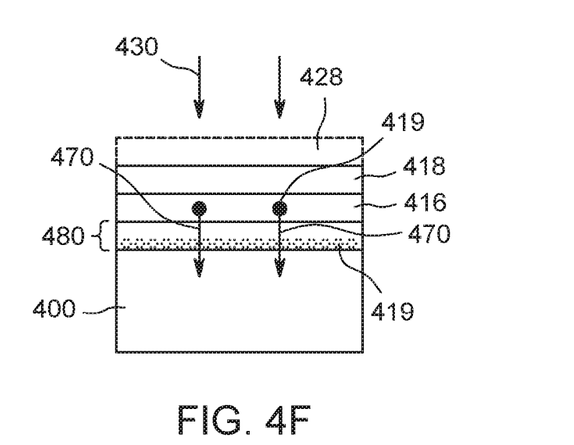

Referring to FIG. 4F, arrow(s) 470 within the structure represent the diffusion or movement of a first aluminum dopant 419 into the high-k dielectric layer 400 upon anneal such as that shown in FIG. 3 at 310. In embodiments, the dopant will travel in the direction of arrow 470 depending upon the reaction conditions such as intensity of anneal 310. In some embodiments, the first aluminum dopant 419 will travel a distance such as along arrow 470 and accumulate at the top surface of the high-K dielectric layer 400, and in embodiments first aluminum dopant 419 is provided in an amount sufficient to cap the high-k dielectric layer 400 as shown by capping layer 480 including aluminum dopant 419 shown in phantom. For example a cap of first aluminum dopant 419 may cover the entire top surface of high-K dielectric layer 400.

In some embodiments, methods in accordance with the present disclosure include treating a high-K dielectric layer disposed on a substrate (not shown), including: (a) sequentially depositing a first titanium nitride layer 414, a first aluminum layer 416, and second titanium nitride layer 418 atop a high-K dielectric layer 400; and (b) heating (e.g., using heat shown as arrow 430) the high-k dielectric layer 400 to a peak temperature of about 900° C. to about 1200° C., wherein the aluminum from the first aluminum layer 416 diffuses into and/or caps the high-k dielectric layer. In embodiments, an aluminum doped high-k dielectric layer 440 includes a first dipole-interface (not shown) sufficient to tune a threshold voltage of the PMOS gate electrode and provide an effective work function at about 5.0 eV. In embodiments, the sequential depositing is performed without a vacuum break.

Figure 5:
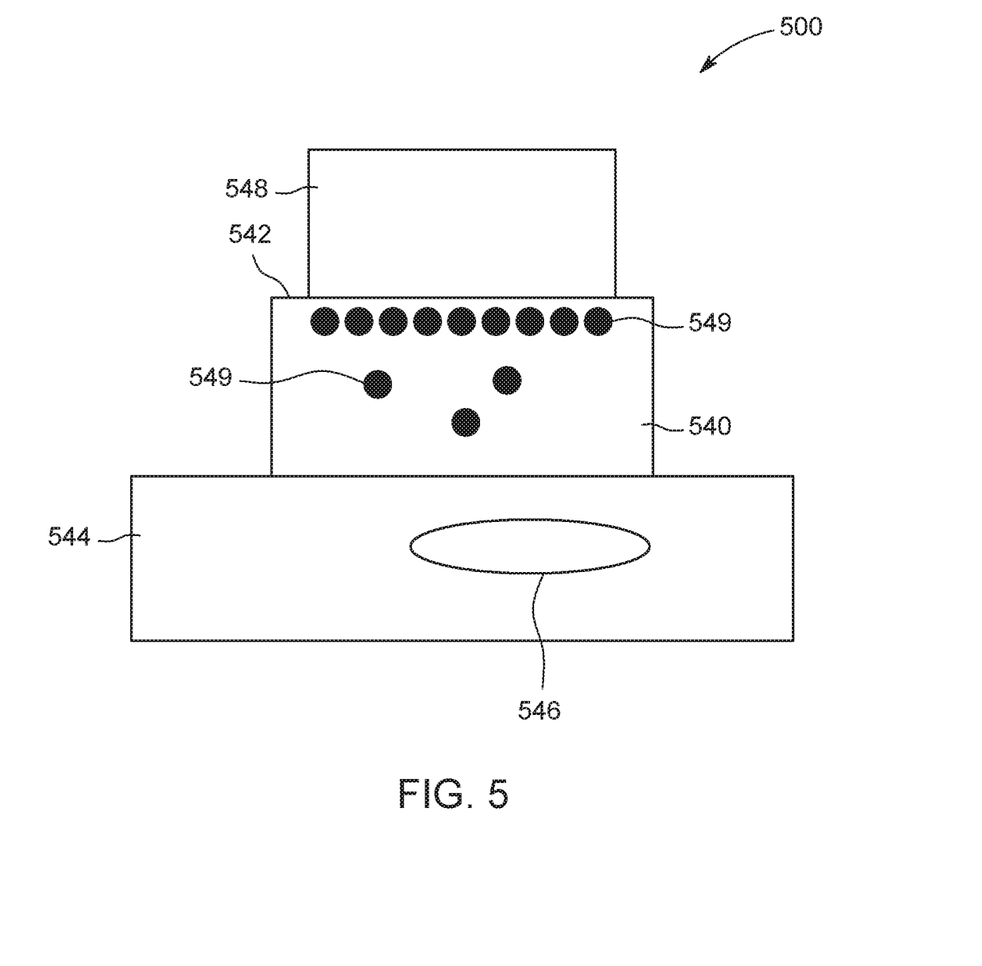
FIG. 5 depicts a cross-sectional view of a PMOS gate electrode of the present disclosure.

Referring to FIG. 5, an apparatus in accordance with the present disclosure includes a PMOS gate electrode 500, including: an aluminum doped high-k dielectric layer 540 having a first surface 542 disposed atop a semiconductor layer 544 including a PMOS area 546; and at least one work function layer 548 disposed atop the first surface 542 of the aluminum doped high-k dielectric layer 540. In embodiments, the aluminum doped high-k dielectric layer 540 includes a first dipole-interface (not shown) sufficient to tune a threshold voltage of the PMOS gate electrode and provide an effective work function of about 5.0 eV. In embodiments, aluminum dopant 549 is disposed on top (e.g., capped) of first surface 542 and/or within the aluminum doped high-k dielectric layer 540. In embodiments, the threshold voltage of PMOS gate electrode 500 is tuned to about 70 mV. In some embodiments, the aluminum doped high-k dielectric layer is capped with aluminum, for example, by the aluminum dopant 549.

Figure 6:
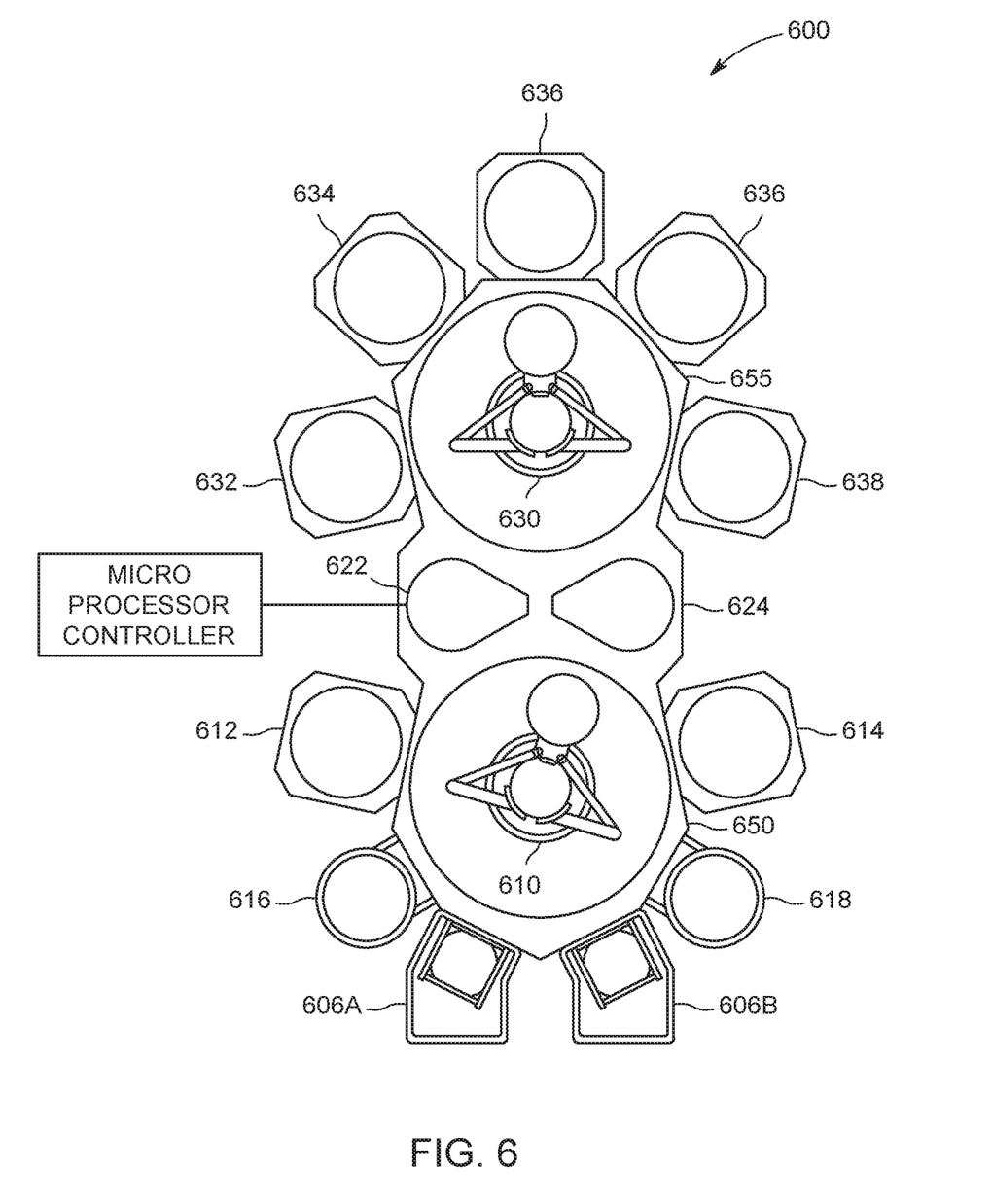
FIG. 6 depicts a cluster tool suitable to perform methods for processing a high-k dielectric layer in accordance with some embodiments of the present disclosure.

Referring now to FIG. 6, an integrated tool may be used to treat the high-K dielectric layer in accordance with the present disclosure. Examples of the integrated tool 600 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps.

The integrated tool 600 can include two load lock chambers 606A, 606B for transferring of substrates into and out of the integrated tool 600. Typically, since the integrated tool 600 is under vacuum, the load lock chambers 606A, 606B may "pump down" the substrates introduced into the integrated tool 600. A first robot 610 may transfer the substrates between the load lock chambers 606A, 606B, and a first set of one or more substrate processing chambers 612, 614, 616, 618 (four are shown) coupled to a first transfer chamber 650. Each substrate processing chamber 612, 614, 616, 618, can be outfitted to perform a number of substrate processing operations. In some embodiments, the first set of one or more substrate processing chambers 612, 614, 616, 618 may include any combination of PVD, ALD, CVD, etch, or degas chambers. For example, in some embodiments, the processing chambers, 612, 614, 616, 618 include two CVD chambers configured to deposit a barrier layer on a substrate and two degas chambers.

The first robot 610 can also transfer substrates to/from two intermediate transfer chambers 622, 624. The intermediate transfer chambers 622, 624 can be used to maintain ultrahigh vacuum conditions while allowing substrates to be transferred within the integrated tool 600. A second robot 630 can transfer the substrates between the intermediate transfer chambers 622, 624 and a second set of one or more substrate processing chambers 632, 634, 635, 636, 638 coupled to a second transfer chamber 655. The substrate processing chambers 632, 634, 635, 636, 638 can be outfitted to perform a variety of substrate processing operations including the method 100 described above in addition to, physical vapor deposition processes (PVD), chemical vapor deposition (CVD), etching, orientation and other substrate processes. In some embodiments, the second set of one or more substrate processing chambers 632, 634, 635, 636, 638 may include any combination of PVD, ALD, CVD, etch, or degas chambers. For example, in some embodiments, the substrate processing chambers 632, 634, 635, 636, 638 include two CVD chambers, a PVD chamber, and two etch chambers. Any of the substrate processing chambers 612, 614, 616, 618, 632, 634, 635, 636, 638 may be removed from the integrated tool 600 if not necessary for a particular process to be performed by the integrated tool 600.

Embodiments of the present disclosure include, an apparatus for film deposition on a substrate, comprising: a central vacuum transfer chamber; a chemical vapor deposition (CVD) and/or Atomic Layer Deposition (ALD) process chamber configured to deposit titanium nitride and coupled to the central vacuum transfer chamber; a chemical vapor deposition (CVD) process chamber configured to deposit metal material such as TiN and aluminum and coupled to the central vacuum transfer chamber; and a physical vapor deposition (PVD) chamber configured to deposit aluminum material and coupled to the central vacuum transfer chamber. In embodiments, CVD and ALD process chambers suitable for depositing the layers of the present disclosure such as the first, second, and third metal layers in accordance with the present disclosure include the semiconductor processing system described in U.S. Pat. No. 6,878,206 entitled Lid Assembly for a Processing System to Facilitate Sequential Deposition Techniques granted on 12 Apr. 2005 and assigned to Applied Materials, Inc. In some embodiments, layers of the present disclosure can be deposited by deposition methods described in U.S. Pat. No. 6,139,905 entitled Integrated CVD/PVD Al Planarization Using Ultra-thin Nucleation Layers granted on 31 Oct. 2000 to Applied Materials, Inc.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure. While the foregoing is directed to embodiments of the present disclosure, other and further embodiments of the disclosure may be devised without departing from the basic scope thereof.

While the foregoing is directed to embodiments of the present disclosure, other and further embodiments of the disclosure may be devised without departing from the basic scope thereof.

The invention claimed is:

1. A method for forming a semiconductor structure, comprising:
    depositing a doping stack having a first surface atop a high-k dielectric layer, wherein the doping stack comprises at least one first metal layer having a first surface, at least one second metal layer comprising a first aluminum dopant and a first surface, wherein the second metal layer is atop the first surface of the first metal layer, and at least one third metal layer atop the first surface of the second metal layer;
    depositing an anneal layer atop the first surface of the doping stack;
    annealing to diffuse at least the first aluminum dopant into the high-k dielectric layer;
    removing the anneal layer; and
    depositing at least one work function layer atop the first surface of the doping stack.

2. The method of claim 1, wherein the first metal layer and third metal layer is TiN.

3. The method of claim 1, wherein the second metal layer is an aluminum composition comprising: aluminum, titanium aluminide, titanium-aluminum carbide, titanium aluminum nitride, aluminum nitride, aluminum carbide, aluminum oxide, hafnium aluminide carbide, or combinations thereof.

4. The method of claim 1, wherein annealing comprises heating the doping stack to a temperature at or above 700° C.

5. The method of claim 1, wherein the annealing layer comprises polysilicon.

6. The method according to claim 1, wherein in the first metal layer has a thickness of about 2 angstroms to about 10 angstroms.

7. The method of claim 1, wherein the second metal layer has a thickness of about 2 angstroms to about 10 angstroms.

8. The method of claim 1, wherein the third metal layer has a thickness of about 5 angstroms to about 15 angstroms.

9. The method of claim 1, wherein the high-k dielectric layer comprises HfAlO, HfAlON, HfSiAlON, HfLaON, and combinations thereof.

10. The method according to claim 1, wherein in the high-k dielectric layer, the first metal layer, second metal layer, and third metal layer may be formed by one of physical vapor deposition, chemical vapor deposition, and atomic layer deposition.

11. The method of claim 1, further comprising:
    wherein the at least one first metal layer is a first titanium nitride layer atop the high-k dielectric layer;
    wherein the at least one second metal layer is a first aluminum layer atop the first titanium nitride layer;
    wherein the at least one third metal layer is a second titanium nitride layer atop the first aluminum layer; and
    wherein annealing to diffuse at least the first aluminum dopant into the high-k dielectric layer includes annealing the high-k dielectric layer, first titanium nitride layer, first aluminum layer, and second titanium nitride layer at a temperature above 900° C.

12. The method of claim 11, wherein prior to annealing, a first reaction prevention layer is applied atop the second titanium nitride layer.

13. The method of claim 11, wherein the first aluminum layer is a film having a thickness of about 2 angstroms to about 10 angstroms.

14. The method of claim 11, wherein annealing at a temperature above 900° C. diffuses aluminum from the first aluminum layer at least one of into or onto the high-k dielectric layer.

15. The method of claim 1, wherein the at least one first metal layer is a first titanium nitride layer, wherein the at least one second metal layer is a first aluminum layer, and wherein the at least one third metal layer is a second titanium nitride layer, and further comprising:
    (a) sequentially depositing the first titanium nitride layer, the first aluminum layer, and the second titanium nitride layer atop the high-k dielectric layer; and (b) heating the high-k dielectric layer to a peak temperature of about 900° C. to about 1200° C.

16. The method according to claim 15, wherein the second titanium nitride layer is formed to be thicker than the first titanium nitride layer.

17. The method of claim 15, wherein in the first titanium nitride layer has a thickness of about 2 angstroms to about 10 angstroms.

18. The method of claim 15, wherein the first aluminum layer has a thickness of about 2 angstroms to about 10 angstroms.

19. The method of claim 15, wherein second titanium nitride layer has a thickness of about 5 angstroms to about 15 angstroms.

20. The method of claim 15, wherein the first titanium nitride layer has a thickness of about 2 angstroms to about 10 angstroms, and the second titanium nitride layer has a thickness of about 5 angstroms to about 15 angstroms.

* * * * *